US005841651A

United States Patent [19]

Fu

[11] Patent Number: 5,841,651
[45] Date of Patent: Nov. 24, 1998

[54] CLOSED LOOP ADAPTIVE CONTROL OF SPECTRUM-PRODUCING STEP USING NEURAL NETWORKS

[75] Inventor: Chi Yung Fu, San Francisco, Calif.

[73] Assignee: The United States of America as represented by the United States Department of Energy, Washington, D.C.

[21] Appl. No.: 973,865

[22] Filed: Nov. 9, 1992

[51] Int. Cl.⁶ .................................................. G01R 29/00
[52] U.S. Cl. .............................. 364/148; 216/59; 216/61; 156/643.1
[58] Field of Search ................................... 364/148–152; 250/341; 395/21, 22, 25; 427/34; 216/59, 60, 61, 58, 62, 63, 65–68; 156/345, 643.1, 626.1, 625.1, 627.1; 204/192.13, 192.33, 298.03, 298.32

[56] References Cited

U.S. PATENT DOCUMENTS

| | | | |
|---|---|---|---|
| 4,226,896 | 10/1980 | Coburn et al. | 427/34 |
| 5,014,219 | 5/1991 | Savage | 364/498 |
| 5,107,119 | 4/1992 | Kimura et al. | 250/341 |
| 5,160,402 | 11/1992 | Cheng | 156/627 |
| 5,166,525 | 11/1992 | Rodgers et al. | 250/341.4 |
| 5,212,821 | 5/1993 | Gorin et al. | 395/22 |
| 5,214,744 | 5/1993 | Schweizer | 395/21 |
| 5,458,732 | 10/1995 | Butler et al. | 216/61 |
| 5,467,883 | 11/1995 | Frye et al. | 216/60 |
| 5,486,235 | 1/1996 | Ye et al. | 134/1.1 |

OTHER PUBLICATIONS

Sze, S. M., "VLSI Technology", 2d. Ed., pp. 233–326 (1988).

C. D. Himmel et al., "A Comparison of Statistically–Based and Neural Network Models of Plasma Etch Behavior", IEEE/SEMI Int. Semiconductor Manufacturing Symposium, 124–129 (Jun. 15, 1992).

R. Shadmehr et al., "Principal Componet Analysis of Optical Emission Spectroscopy and Mass Spectromety: Application to Reactive Ion Etch Process Parameter Estimation Using Neural Networks", J. Electrochem. Soc., vol. 139, No. 3, 907–914 (Mar. 1992).

Fu–Chuang Chen, "Back–Propagation Neural Networks for Nonlinear Self–Teaching Adaptive Control", 1990 Apr. 30, 44–48.

Compton & Landon, "Parallel Detection Systems Offer Advantages Beyond the Obvious", Applications Review, published by Tracor Northern (1985).

(List continued on next page.)

*Primary Examiner*—Reba I. Elmore
*Assistant Examiner*—Thomas E. Brown
*Attorney, Agent, or Firm*—Richard B. Main; Henry Sartorio; William R. Moser

[57] ABSTRACT

Characteristics of the plasma in a plasma-based manufacturing process step are monitored directly and in real time by observing the spectrum which it produces. An artificial neural network analyzes the plasma spectrum and generates control signals to control one or more of the process input parameters in response to any deviation of the spectrum beyond a narrow range. In an embodiment, a plasma reaction chamber forms a plasma in response to input parameters such as gas flow, pressure and power. The chamber includes a window through which the electromagnetic spectrum produced by a plasma in the chamber, just above the subject surface, may be viewed. The spectrum is conducted to an optical spectrometer which measures the intensity of the incoming optical spectrum at different wavelengths. The output of optical spectrometer is provided to an analyzer which produces a plurality of error signals, each indicating whether a respective one of the input parameters to the chamber is to be increased or decreased. The microcontroller provides signals to control respective controls, but these lines are intercepted and first added to the error signals, before being provided to the controls for the chamber. The analyzer can include a neural network and an optional spectrum preprocessor to reduce background noise, as well as a comparator which compares the parameter values predicted by the neural network with a set of desired values provided by the microcontroller.

8 Claims, 6 Drawing Sheets

OTHER PUBLICATIONS

Hirose, et al., "Back–Propagation Algorithm Which Varies the Number of Hidden Units", Neural Networks, vol. 4, pp. 61–66 (1991).

Jenkins, et al., "The Modeling of Plasma Etching Processes Using Response Surface Methodology", Solid State Technology Journal, vol. 29, No. 4, pp. 175–182 (1986).

Kaufmann, et al., "Introduction to Fuzzy Arithmetic", Van Nostrand Reinhold Company, pp. 8–15 (1985).

Lawrence, J., "Data Preparation for a Neural Network", AI Expert, pp. 34–41, Nov. 1991.

Lee, C. C., "Fuzzy Logic in Control Systems: Fuzzy Logic Controller—Parts I and II", IEEE Transactions on Systems, Man, and Cybernetics, vol. 20, No. 2, pp. 404–435, Mar./Apr. 1990.

Lippmann, R. P., "An Introduction to Computing with Neural Nets," IEEE ASSP Magazine, pp. 4–22, Apr. 1987.

Malchov, D. S., "Characterization of Plasma Processes with Optical Emission Spectroscopy", SPIE, Advanced Techniques for Integrated Circuit Processing, vol. 1392, pp. 498–505 (Oct. 4, 1990).

Rigler, et al., "Rescaling of Variables in Back Propagation Learning", Neural Networks, vol. 4, pp. 225–229 (1991).

Singer, P. H., "Diagnosing Plasmas and Detecting Endpoints", Semiconductor International, pp. 66–70, Aug. 1988.

Sun, et al., "Fuzzy Modeling Based on Generalized Neural Networks and Fuzzy Clustering Objective Functions", Proceedings of the 30th IEEE Conference on Decision and Control (1991).

Sze, S. M., "VLSI Technology", 2d. Ed., pp. 184–239, 262–269, 386–400 (1988).

Tracor Northern, "The Role of Photodiode Array Detectors in 'Snap–Shot' Spectroscopy" (1985).

Weir, M. K., "A Method for Self–Determination of Adaptive Learning Rates in Back Propagation", Neural Networks, vol. 4, pp. 371–379 (1991).

Zadeh, L. A., "Fuzzy Logic", IEEE Computer, pp. 83–93 (1988).

Zadeh, L. A., "Fuzzy Sets", Information and Control, vol. 8, pp. 338–353 (1965).

CLOSED LOOP ADAPTIVE CONTROL OF SPECTRUM-PRODUCING STEP USING NEURAL NETWORKS

The United States Government has rights in this invention pursuant to Contract No. W-7405-ENG-48 between the U.S. Department of Energy and the University of California, for the operation of Lawrence Livermore National Laboratories.

BACKGROUND OF THE INVENTION

1. Field of the Invention

The invention relates to plasma-based wafer processing techniques, and more particularly, to neural network control systems for the same. The invention also relates to neural network-based control of processes whose spectra reveal process input parameters.

2. Description of Related Art

Plasma-based processing equipment is used in the manufacture of several different types of products. For example, it is used in the formation or etching of layers in a semiconductor manufacturing process. It is also used in the deposition of thin films used, for example, in superconducting circuits. It is also used in the production of active matrix liquid crystal displays, and in the thin films required for magnetic and optical storage media.

A plasma is a collection of electrons, radicals, positive and negative ions, neutral atoms, molecules and molecular fragments. The plasma excitation can be caused by RF or microwave frequency power applied, or by other methods as well. The plasma can also be enhanced by coupling with a magnetic field.

Plasmas are used in semiconductor and thin film manufacturing, primarily in several types of process steps. In plasma-enhanced chemical vapor deposition (PECVD), input gases are reacted in a glow discharge to form a plasma, which reacts chemically at a subject surface (e.g., a wafer) to deposit a desired material thereon. Plasma enhanced (assisted) depositions are described in Sze, "VLSI Technology", 2d. Ed. (1988), primarily at pp. 262–266. The entire Sze reference is incorporated by reference herein. In a "sputtering" technique, a plasma is formed in a manner similar to that in PECVD, but the plasma is attracted to a target. The plasma bombards the target with high enough energy to loosen particles of the target material, such as aluminum, which then deposit on the subject surface. Sputtering deposition is described primarily at p. 387 of Sze.

In a plasma etching technique, the plasma generates highly reactive fragments and radicals which react with the surface material to form volatile products. These volatile products leave the surface, resulting in etching. In reactive ion etching (RIE), in addition to the chemical reactions, ions are accelerated toward the surface material and either react directly with the material or assist in the reaction by a radical, thus enhancing the etching process. Reactive plasma etching is described primarily at pp. 184–232 of Sze, and RIE is described in Sze, primarily at pp. 213–215 and 396–398. In all of these techniques, it is important that the flow rate of the gases provided to form the plasma, the plasma power applied to form the plasma, the biasing of the subject surface, the temperature of the subject surface, and the pressure inside the chamber containing the plasma and the subject surface, be carefully controlled so that a plasma having exactly the desired characteristics is formed.

In the past, plasma-based processing equipment has used individual closed-loop control of the input parameters such as pressure, power and gas flow, to try to maintain them each at a value known to produce a desired plasma. This type of control is indirect since it is not the measured parameters that individually control the outcome of the process, but the combined effect of all the parameters. Such control systems also fail to take into account calibration errors in the controls, as well as other, uncontrolled, sources of gas which may affect the plasma. For example, in oxygen-reactive sputtered deposition, useful for example to deposit $Al_2O_3$, the oxygen flowing through the mass flow controller into the chamber may not be the only source of oxygen. Oxygen may also be out-gassing from the interior walls of the chamber. Extra sources of gas such as outgassing are not accounted for in the case of conventional process control. Thus, although each input parameter to the plasma-based process step is under closed-loop control, the overall process step may not be entirely closed-loop. Yields may thereby be reduced, and manufacturing costs increased.

The conventional technique is also very difficult to model for process optimization. For a conventional plasma processing step, fundamental process modeling requires a detailed understanding and application of plasma physics which, though making substantial progress, is not yet readily available in a manufacturing environment. Thus, process optimization requires extensive experimentation on actual equipment and is typically statistically based. In addition, moving a process to new or different equipment requires parameter adjustments and substantial downtime, thereby discouraging equipment upgrades and complicating the replacement of worn equipment.

The inadequacies of the conventional technique for controlling input parameters sometimes result in bad runs which process engineers must try to rescue. At present, if a process deviates from specification during processing, the resulting processing errors are corrected either by rework, in which the process is stopped and the erroneous step is redone, or by "feed forward", in which the process continues and adjustments are made in subsequent process steps to compensate for the error. Both options cause logistical and scheduling problems in the operation of the fabrication line. Additionally, merely because the conventional technique accepts errors rather than preventing them, they render reliability of the product uncertain.

Because the conventional technique is not entirely closed-loop, a metrology step is often included after a plasma processing step to measure such results as the thickness of deposited material, resistivity, etc. In the evolving cluster tool concept, equipment is grouped under a vacuum and wafers are transferred between processing systems by robotic arms. Cluster tools typically have a limited number of ports for processing stations. The need to include metrology steps, therefore restricts the number of pieces of processing equipment which may be placed in a cluster.

Apart from the actual wafer processing problems caused by conventional process control equipment, maintenance and repair of the equipment is another major manufacturing issue. Overmaintenance is costly since it unnecessarily increases equipment downtime, but undermaintenance risks faulty products or low yield. At present, repair of processing equipment is typically performed after the equipment fails, which is undesirable because downtime for unscheduled repair can cause significant logistical and schedule problems.

Further, the conventional plasma-based processing technique cannot be used to deposit certain materials or materials with certain properties since the processing for such materials is difficult to control.

SUMMARY OF THE INVENTION

When particles in a plasma relax to a less excited state, they emit energy in a portion of the electromagnetic spectrum which ranges mostly in the extended optic frequency range (including far IR and deep UV). There is a one-to-one correspondence between a given plasma and the input conditions (e.g., gas flow, pressure, plasma excitation frequency and power) for a particular system configuration under which it was produced, but the particular correspondence is in most cases not known and varies from one piece of equipment to another. As discussed in Sze, plasma spectra have been used in the past to determine the presence or absence of particular neutral and ionic species by correlating an experimental spectral series with a previously determined spectral series. Relative concentrations of species were obtainable in this manner, although minor variations were typically too subtle for a process engineer or even a plasma specialist to detect. Plasma spectra have also been used for "endpoint detection", i.e., determining when a plasma processing step is complete. This is possible in an etching step, for example, when the complete removal of an etched layer eliminates the contribution which the etched layer provided to the composition of the plasma. See also Malchov, "Characterization of Plasma Processes with Optical Emission Spectroscopy", SPIE Vol. 1392, Advanced Techniques for Integrated Circuit Processing (Oct. 4, 1990), pp. 498–505, incorporated by reference herein.

According to the invention, roughly described, the characteristics of the plasma in a plasma-based manufacturing process step are monitored directly and in real time by observing the spectrum which it produces. One or more of the process input parameters are controlled or adjusted in response to any deviation of the spectrum beyond a narrow range. This approach is advantageous because the success of the processing step depends on the characteristics of the ultimate plasma, rather than on the separately controlled input conditions in response to which the plasma is formed. If, for example, one of the flow controllers in a conventional system is out of calibration, then it may be maintaining an incorrect flow condition while reporting back that its flow is at the target value. The plasma spectrum will be slightly different, however, and a system which monitors the plasma directly rather than merely an input parameter will be able to compensate for such miscalibration.

As mentioned, the differences between the spectra produced by plasmas are extremely subtle, usually too subtle to be detected by a process engineer or plasma specialist. Additionally, the actual correspondence between the spectrum produced by a plasma and its input parameters are generally not presently known. According to another aspect of the invention, an artificial neural network is used to analyze the plasma spectrum and generate the control signals necessary to adjust one or more of the input parameters as necessary. Neural networks are very effective in identifying small signal changes in a very noisy environment, and can learn the relationships between input parameters and plasma spectra without any requirement that they be derived in advance.

The monitoring of plasma spectra is an advantageous way of controlling the process step since highly reliable optical sensing techniques (e.g., optical spectrometers) are available and are routinely used in semiconductor processing (e.g., to determine when to end a process step). Further, such sensors can be external to the processing chamber and thus avoid perturbing the process step. Optical sensing is also extremely fast, thus allowing real-time monitoring and control of single-wafer processing.

By monitoring the plasma itself at the reaction site, closed-loop control is provided which automatically compensates for otherwise uncontrolled sources of gases, miscalibrations of input parameter controls, and other sources of error not adequately addressed in conventional systems. Thus processing mistakes are prevented by correcting the input parameters in real-time so that the results satisfy the target criteria. Thus the amount of rework and feed forward to correct a processing error is minimized. Additionally, since the process is controlled to satisfy the target criteria of the plasma itself, most metrology equipment may be unnecessary.

Direct monitoring of plasma characteristics also permits a trend analysis of the adjustment signals provided to the input parameter controls. Such trends can predict which components actually require servicing. Thus, servicing and equipment downtime can be scheduled just in time, and, in conjunction with the scheduling of maintenance on other equipment in a fabrication line, can avoid both undermaintenance and overmaintenance.

Further, intelligent adaptive control can be used to deposit materials that were previously not achievable in a plasma-based processing step because the processing for such materials is difficult.

Though not exclusively, intelligent adaptive control may be applied most advantageously in backend plasma processing since backend interconnects strongly influence chip yield, performance and reliability. Applying the technique to backend inter-chip-level interconnects can also impact packaging technology. The technique can be applied in III–V or II–VI processing as well as in silicon-based processing.

BRIEF DESCRIPTION OF THE DRAWINGS

The invention will be described with respect to particular embodiments thereof, and reference will be made to the drawings in which.

DETAILED DESCRIPTION

Figure 1:
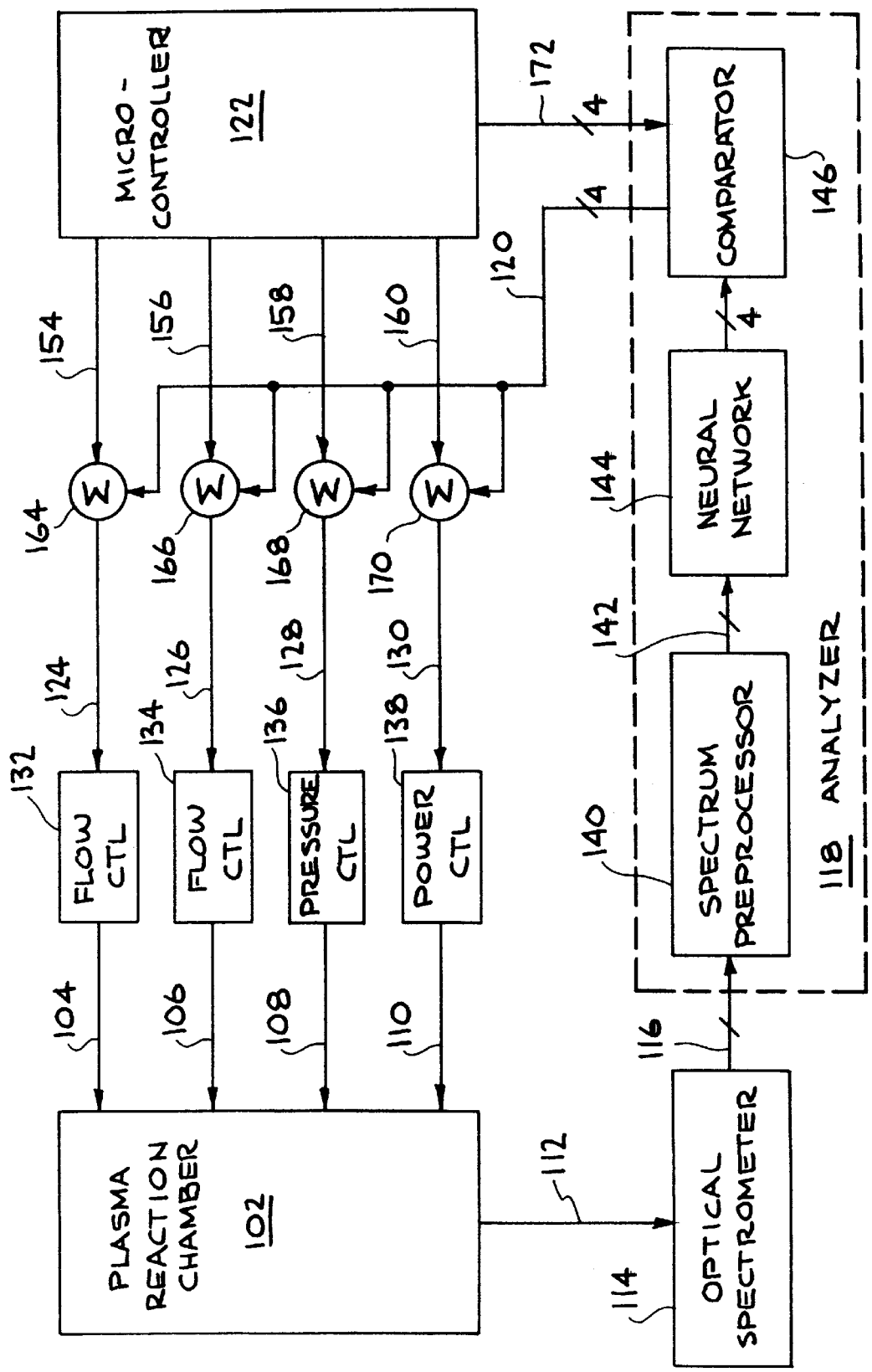
FIG. 1 is a symbolic block diagram of a plasma-based processing control system which may incorporate features of the invention.

FIG. 1 is a symbolic diagram of a plasma-based process control system which may incorporate features of the invention. It comprises a plasma reaction chamber 102 in which a plasma is formed in response to four input parameters 104, 106, 108 and 110. Other input parameters (not shown) such as excitation frequency and temperature also exist, but although they can be controlled in a different embodiment, they are not controlled in this embodiment of the techniques described herein. The symbolic lines 104 and 106 in FIG. 1 may be, for example, tubes carrying respective input gases at respective flow rates. The symbolic line 108 may represent a pipe through which gasses are added to or removed from the plasma reaction chamber 102 in order to maintain a desired operational pressure level, and the symbolic line 110 may represent a power connection to plasma excitation electrodes of the reaction chamber 102.

The reaction chamber 102 comprises a quartz window (not shown) through which the electromagnetic spectrum produced by a plasma in the chamber 102, just above the subject surface, may be viewed. The spectrum is conducted preferably by an optical fiber 112 to an optical spectrometer 114. The optical spectrometer 114 measures the intensity of the incoming optical spectrum at 1024 different wavelengths ("channels"), with a wavelength resolution of 0.59 nm. An example of an adequate spectrometer is the Model TN-6650, manufactured by Tracor Northern, Middleton, Wis. (now known as Noran Instruments, Inc.). This spectrometer is described in Tracor Northern, "The Role of Photodiode Array Detectors in 'Snap-Shot' Spectroscopy", incorporated herein by reference. See also Compton & Landon, "Parallel Detection Systems Offer Advantages Beyond the Obvious", Applications Review, published by Tracor Northern (1985).

The output of optical spectrometer 114 is provided electronically over a bus 116 to an analyzer 118, which analyzes the electronically represented spectrum and produces a plurality of error signals over lines 120. The error signals each indicate to a microcontroller 122 whether a respective one of the input parameters to the plasma reaction chamber 102 is to be increased or decreased. A microcontroller 122 provides signals in a conventional manner over lines 154, 156, 158 and 160 to control respective controls 132, 134, 136 and 138, but these lines are intercepted and provided as inputs to respective summers 164, 166, 168 and 170. The second input of each of the summers receives a respective error signal from lines 120, and the summer outputs are connected over respective lines 124, 126, 128 and 130 to controls 132, 134, 136 and 138. The control 132 is a flow controller which adjusts the flow rate of one of the input gases to the plasma reaction chamber 102. The control 134 is also a flow controller which controls the flow rate of another of the input gases to reaction chamber 102. The control 136 is a pressure controller which controls the pressure in reaction chamber 102, and control 138 is a power controller which controls the plasma power applied to generate the electric excitation field in the plasma reaction chamber 102. Although four particular input parameters are shown for the plasma reaction chamber 102, it will be understood that a smaller or larger number of such parameters could be controlled in a different embodiment. Note that the error signals 120 could be provided directly to the microcontroller 122 instead of to inserted summers, but the use of inserted summers permits an existing control system to be adapted with only minor modification. This is desirable especially where the microcontroller 122 performs other production tasks as well as controlling chamber 102. It is also desirable because it facilitates easy upgrade of existing field equipment.

Analyzer 118 comprises an optional spectrum preprocessor 140, which receives the electronically represented plasma spectrum over bus 116 and preprocesses it to reduce background information and filter out any biases in the data. As will be seen, the spectrum preprocessor 140 is not always necessary to the effectiveness of the system. For example, if there are no biases affecting the accuracy of the received spectrum, then it may be possible to omit the preprocessor with the only consequence being a more lengthy training period to overcome background signal.

The output of the spectrum preprocessor 140 is provided over a bus 142 to the input nodes of a neural network 144. Neural network 144 may have any of a wide variety of known network architectures. Background information on neural networks, including a survey of various architectures for neural networks may be found in "DARPA Neural Network Study", Armed Forces Communications and Electronics Association International Press, November 1988, and in R. P. Lippmann, "An Introduction to Computing with Neural Nets," IEEE ASSP Magazine, April 1987, both incorporated herein by reference. The neural network 144 may be constructed in any known manner, but the techniques described in U.S. patent application Ser. No. 07/894,391, filed Jun. 5, 1992, entitled "Process for Forming Synapses in Neural Networks and Resistor Therefor", by inventor Chi Yung Fu, incorporated herein by reference, are preferred. In an alternative embodiment, the neural network can be implemented in software on a computer.

As set forth in that patent application, a neural network typically comprises a plurality of input neurons, which may simply be isolation buffers and which are sometimes referred to as "first level neurons", to receive input excitation signals. The outputs of the input neurons are coupled to selected ones of the inputs of a plurality of second level neurons via synaptic interconnection circuits or synapses. Different ones of the input signals combine with different weights at the inputs of the second level neurons, and the particular weight to be accorded each signal is governed by a setting in the synaptic interconnection circuit which couples that signal to that neuron. The weighted combination of signals is typically a weighted sum of such signals, and may further be transformed by a transfer function which is typically (but not necessarily) nonlinear. A common nonlinear transformation for this purpose is the sigmoid function. The outputs of the second level neurons may themselves further be coupled through another set of synaptic interconnection circuits, with respective weights, to inputs of respective ones of a plurality of third level neurons. In this case the second level neurons are often referred to as "hidden" neurons. The outputs of the third level neurons may be provided as the outputs of the overall network, in which case these neurons may be referred to as "output neurons", or they may be coupled to yet additional layers of neurons by additional selectively weighted synaptic interconnection circuits. In addition, in some neural network architectures, outputs of some of the neurons are fed back to the inputs of a prior level.

Neural networks may have a fixed interconnection pattern and fixed synaptic weights, or the synaptic weights may be made variable. If the synaptic weights are made variable, then the network may be given the capacity to "learn". Alternatively, the learning process may be simulated off-line, and once the synaptic interconnection weights are determined, they can be transferred into a hardware chip, for example by laser direct write.

In the analyzer 118 of FIG. 1, the output bus 142 of spectrum preprocessor 140 is connected to the excitation inputs of respective first-level neurons in the neural network 144. The neural network 144 may be a three-level network, for example, whose synaptic weights have been set according to the correspondence between plasma spectra and the input parameters in response to which each plasma is formed. Thus the neural network 144 performs a conversion between the input spectrum on bus 142 and a set of signals predicting the input parameters in response to which the plasma was produced.

Figure 6:
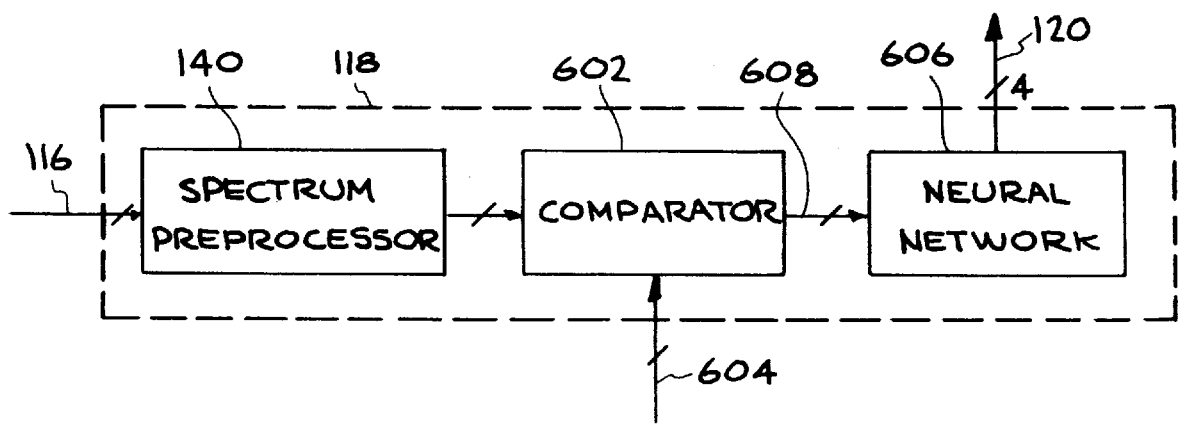
FIG. 6 is a symbolic block diagram of an alternative analyzer of FIG. 1.

The analyzer 118 further contains a comparator 146 which compares the input parameter values predicted by neural network 144 with a set of desired values which are known to produce an optimum plasma. Such desired values may be provided by microcontroller 122 over lines 172. The comparator outputs the result of these comparisons as a set of error signals on the lines 120 to the summers 164, 166, 168 and 170 which appropriately modify control signals 154, 156, 158 and 160 from the microcontroller 122 in a conventional manner. The comparator 146 may be microprocessor-based, may be hardwired, and/or may be included as part of the software in microcontroller 122. (Note that it is possible to include the functions of the entire analyzer 118, the summers and the microcontroller 122, all in software running on a microcomputer, or in a neural network controller, or in a combination of both.) FIG. 6 shows another example of an analyzer 118 in which the output of preprocessor 140 is provided first to a comparator 602, which compares the preprocessed spectrum signals to a desired set of spectrum signals provided over lines 604. The difference signal outputs (one for each channel) are provided over lines 608 to a neural network 606, which generates the error signals over lines 120.

The operation of the controller of FIG. 1 will be described with respect to a semiconductor process step which involves reactive ion etching (RIE) of an oxide in a batch-type parallel-plate reactor, processing several wafers per run. To illustrate the effectiveness of the controller, a particularly difficult set of gases is chosen for the production of the plasma. In particular, the combination of $CHF_3+H_2$ is used to form the plasma, a combination in which it is usually difficult to obtain repeatable results due to high polymerization.

In order to determine the synaptic weights to be programmed into the neural network 144, a series of experiments is conducted. The statistical technique of response surface methodology (RSM) may be used to select the particular experiments to be performed. RSM is described in Jenkins, et al., "The Modeling of Plasma Etching Processes Using Response Surface Methodology", Solid State Technology Journal, Vol. 29, No. 4, pp. 175–182 (1986), incorporated by reference herein. In particular, the center cube experimental design methodology is used to select 30 experiments to perform, six of which are repetitions. For the present illustration, the four input parameters are permitted to vary over exceedingly wide ranges as follows:

$CHF_3$ flow rate=70–110 sccm $H_2$ flow rate=0.0–4.0 sccm

Pressure=50–70 mTorr

Rf power=400–800 Watts

These input parameter ranges permit oxide etch rates from about −45 through 800 Å per minute, amorphous silicon etch rates of −5 through 60 Å per minute, and an etch selectivity of 7–35. From these ranges, the following 30 experiments are performed:

| Trial No. | $H_2$ Flow Rate (sccm) | $CHF_3$ Flow Rate (sccm) | Power (Watts) | Pressure (mTorr) |
|---|---|---|---|---|
| 1 | 2 | 90 | 600 | 60 |
| 2 | 1 | 80 | 700 | 55 |
| 3 | 1 | 100 | 500 | 55 |
| 4 | 3 | 100 | 500 | 65 |
| 5 | 1 | 100 | 700 | 65 |
| 6 | 2 | 90 | 600 | 60 |
| 7 | 1 | 80 | 500 | 65 |
| 8 | 3 | 100 | 700 | 55 |
| 9 | 3 | 80 | 500 | 55 |
| 10 | 3 | 80 | 700 | 65 |
| 11 | 3 | 100 | 500 | 55 |
| 12 | 2 | 90 | 600 | 60 |
| 13 | 1 | 100 | 500 | 65 |
| 14 | 3 | 80 | 700 | 55 |
| 15 | 1 | 80 | 700 | 65 |
| 16 | 3 | 80 | 500 | 65 |
| 17 | 3 | 100 | 700 | 65 |
| 18 | 1 | 100 | 700 | 55 |
| 19 | 1 | 80 | 500 | 55 |
| 20 | 2 | 90 | 600 | 60 |
| 21 | 2 | 90 | 600 | 60 |
| 22 | 4 | 90 | 600 | 60 |
| 23 | 2 | 90 | 800 | 60 |
| 24 | 2 | 90 | 600 | 60 |
| 25 | 2 | 90 | 400 | 60 |
| 26 | 2 | 90 | 600 | 50 |
| 27 | 0 | 90 | 600 | 60 |
| 28 | 2 | 70 | 600 | 60 |
| 29 | 2 | 90 | 600 | 70 |
| 30 | 2 | 110 | 500 | 60 |

Once the characterization experiments are determined, they are each performed on the actual equipment by having the microcontroller 122 supply the input parameters for each particular experiment to the inputs of the controls 132, 134, 136 and 138 such that the plasma responsive to the specified input parameters is actually formed in the reaction chamber 102. The system and each of its essential components must be operating correctly and be accurately calibrated for these experiments. The summers 164, 166, 168 and 170 are either temporarily removed or their second inputs are held at zero. Actual spectral data is obtained for each experiment and the neural network parameters are determined as hereinafter described.

Figure 2:
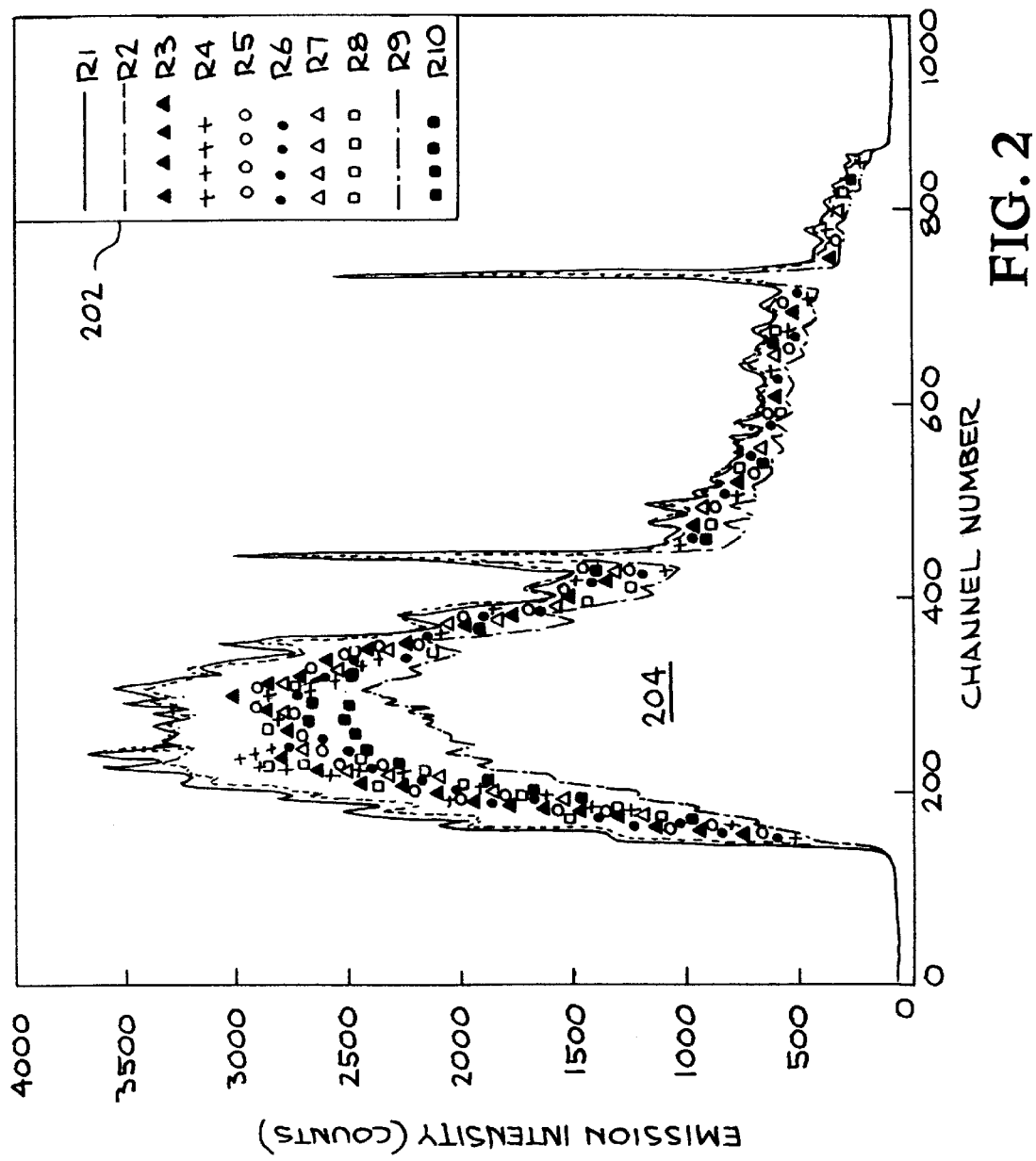
FIG. 2 is a plot of plasma spectra produced in response to several experimental sets of input parameters.

FIG. 2 is a plot of the spectrum output 116 of optical spectrometer 114 for nine of the experiments as indicated in the key 202. In the plot of FIG. 2, each of the channel numbers on the horizontal axis each cover a different wavelength in the optical spectrum produced by the plasma in reaction chamber 102, and the vertical axis represents the intensity of electromagnetic radiation detected at the wavelength of each channel. As can be seen from FIG. 2, because of the particular grating and spectrometer used, the only channels which contain any data are those from approximately channel 140 through approximately channel 870. There are, in fact, only 721 (or 731) channels which contain useful data. Accordingly, although the optical spectrometer 114 analyzes 1024 channels, only 721 need be provided over bus 116 to the analyzer 118. The grating used is Model No. TN-6049-EG9, manufactured by Tracor Northern, and the detector is Model No. TN-6144, by the same manufacturer.

It can also be seen from FIG. 2 that a large area 204 contains only background information which does not change for the different ones of the experiments. Accordingly, the spectrum preprocessor 140 should desirably remove this background information to provide the neural network 144 excitation inputs with the widest possible dynamic range. Such background information can be largely cancelled with the following formula:

$$O_i=(I_i-A_i)/A_i,$$

where $I_i$ is the input intensity value for channel i;

$A_i$ is the nearby average intensity value for a small range of channels bracketing channel i, for example, $I_{i-5}$ through $I_{i+5}$; and $O_i$ is the preprocessed output intensity value for channel i.

Another possible background cancelling formula is $O_i=I_i-A_i$. Still another possible formula is $O_i=I_i/I_{i-1}$. None of these formulas is perfect, but as previously mentioned, any imperfections are accommodated in the weightings which will be learned by the neural network.

Although not shown in FIG. 2, the spectrum produced by optical spectrometer 114 is also undesirably affected by polymer deposited by the plasma on the inside surface of the quartz window through which the plasma is viewed. The deposited polymer forms a non-uniform filter as a function of frequency which is desirably compensated by the spectrum preprocessor 140. It can be seen that the first of the preprocessing formulas set forth above will remove most of the effect of the polymer filter. Again, any imperfections in the formula can be accommodated in the weightings programmed into the neural network 144. In this learning step, if the weightings are determined by a software simulation rather than a learning mode of an actual neural network, then the spectrum preprocessor functions can be performed off-line before being provided to the software simulator.

Figure 3:
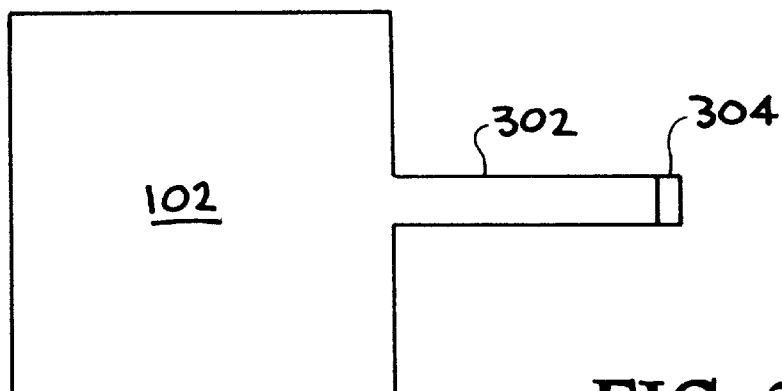
FIG. 3 is a symbolic diagram of a plasma reaction chamber.

Although the preprocessing and the neural network 144 can compensate for or accommodate polymer filtering, it is preferred that the filtering be avoided in the first instance. This can be accomplished with a reaction chamber 102 designed as shown in cross-section in FIG. 3. In particular, the reaction chamber includes a narrow tube 302 which is in direct communication with the interior of the chamber 102, and which terminates with the quartz window 304. The optical spectrum produced by the plasma passes through the tube 302 before it reaches the quartz window 304. In this arrangement, the tube 302 can be made narrow and long enough such that any polymer formed by the plasma which enters the tube 302 deposits on its interior surfaces rather than on the inside surface of quartz window 304.

Figure 4:
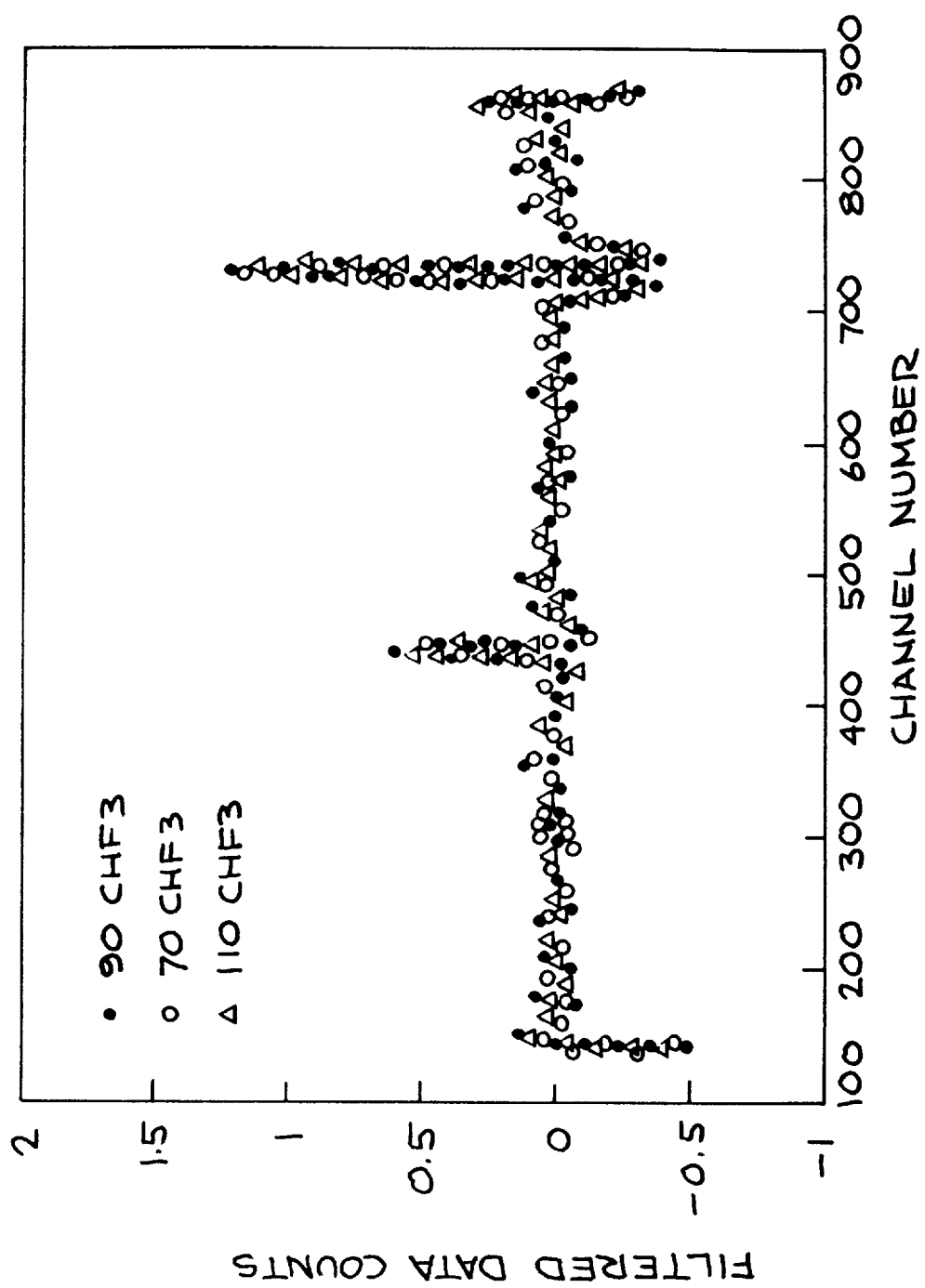
FIG. 4 is a plot showing the spectrum output of the preprocessor of FIG. 1 in response to several of such experiments.

FIG. 4 is a plot showing the spectrum output of preprocessor 140 for three of the experiments, preprocessed in accordance with the first-mentioned preprocessing formula set forth above. As can be seen, the spectra are virtually identical for the three plasmas, and therefore virtually impossible for a human being to distinguish and thereby control the plasma etching step.

After a preprocessing algorithm is determined, the experimental data preprocessed thereby and the resulting spectrum are used to teach the neural network. If the neural network 144 is of the self-learning type, then it is placed in its learn mode and allowed to learn what its inputs would look like for the outputs which it would be expected to generate for each set of experimental data. If the neural network 144 is not of the self-learning type, then suitable simulation software may be used to simulate the learning process. An adequate off-the-shelf software package which can be used for this purpose is entitled "NeuralWorks Professional II/Plus", manufactured by NeuralWare, Inc., Pittsburgh, Pa.

Figure 5:
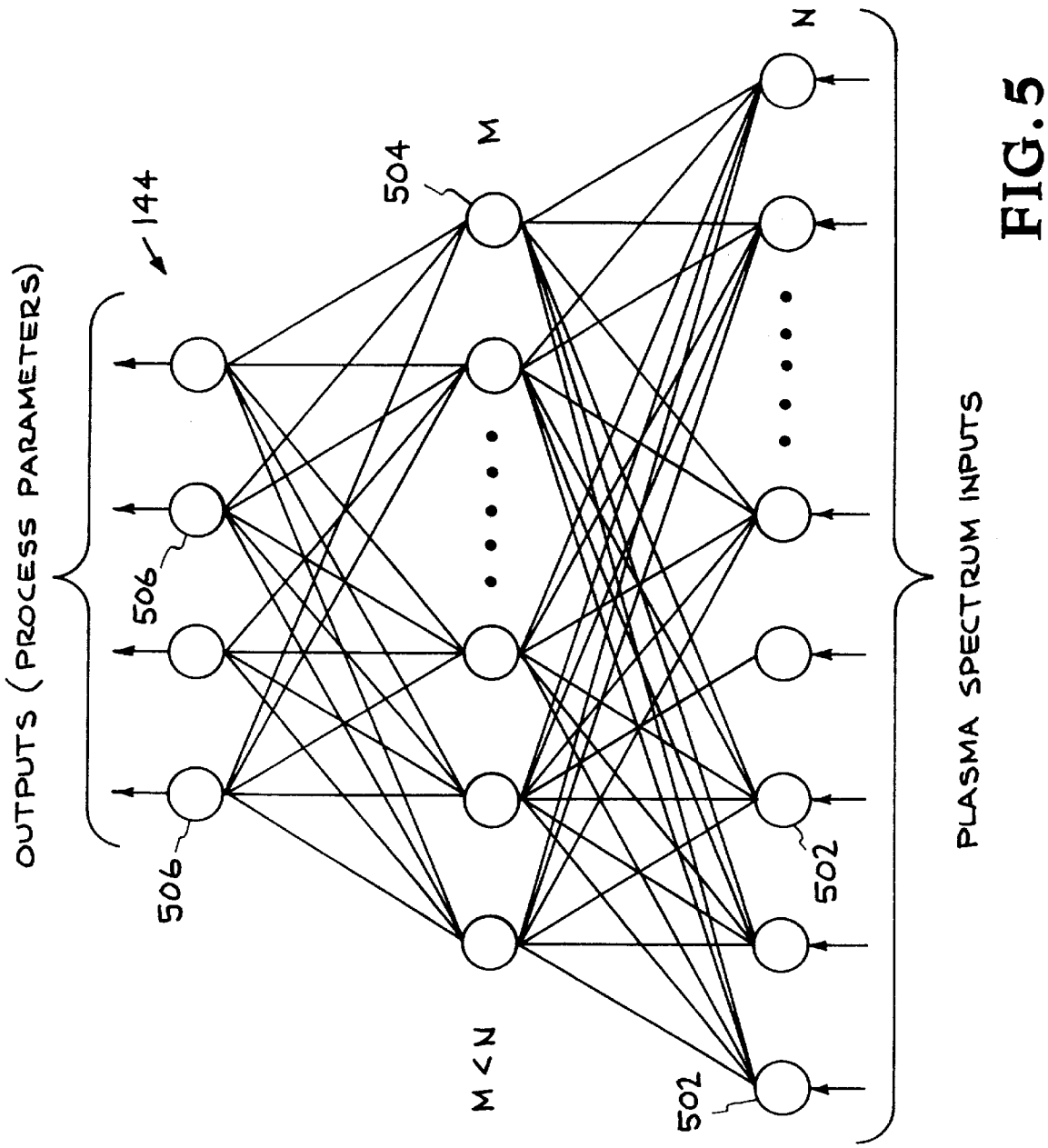
FIG. 5 is a symbolic diagram of a neural network topology.

For the purposes of the present illustration, a three-level neural network 144, with fixed weights and without feedback, is selected. The topology of such a network is shown in FIG. 5. As shown, the neural network 144 has N input excitation inputs 502, M second-level neurons 504 (M<N), and four output neurons 506. Since only 721 input channels contain useful information, only 721 neurons 502 (N=721) are needed for the neural network 144. Further, for this illustration, M is chosen as M=8 second-level neurons. The total number of neurons in neural network 144, therefore, is only 743.

After the software simulations described above are used to determine the synaptic weights for the neural network 144, it is often useful to examine a Hinton diagram of the weights thus determined. In the present illustration, examination of the Hinton diagram reveals that the network considers only a few groups of the input channels as significant in its determination of a set of the input parameter values, and the species related to the groups are the derivatives of H, F, C, N, O. Since the system is not leak-tight, the presence of N and O is expected. All the remaining input excitation neurons 502 of the neural network 144 and their associated weights may therefore be omitted to reduce the complexity of the control system. The spectrum preprocessor 140 also need not preprocess the channels which will not ultimately be provided to the neural network 144, and the optical spectrometer 114 need not provide them (other than as necessary to accomplish any nearby averaging used in the preprocessor formula). This will also improve the response of the optical spectrometer.

For example, when only H is allowed to vary, the learning process identifies only three groups of input neurons whose synaptic connections to the second-level neurons have significantly non-zero weights. The three groups of input neurons determined by the learning process to be significant, correspond to the wavelengths of two hydrogen spectral peaks and one wavelength which does not appear to correspond to a spectral peak of hydrogen. The network's consideration of the last-mentioned group, occurring at about wavelength $\lambda$=429.34 nm, was unexpected. But the possibility that this spectral line corresponds to CH is a reasonable one since excessive $H_2$ will increase polymerization and thus the occurrence of the CH line. Thus the CH line may be a more sensitive indicator for conditions where $H_2$ flow is high. The ability of neural networks to select the most pertinent channels to help distinguish the various plasmas, without any guidance from human experts and without needing any explicit rules specified for the plasma diagnostics, illustrates another reason why the use of a neural network in a plasma-based process step control system is advantageous.

The Hinton diagram also reveals a channel broadening for spectral line identification, meaning that the neural network considered relevant not only the particular channel in which the identified spectral peaks are located, but also several channels on either side as well. It is believed that such channel broadening may have occurred due to possible drift in the spectrometer 114. Again, the ability of a neural network to accommodate such drift further illustrates the value of the use of a neural network in a plasma-based processing step control system.

Once the synaptic connection weights are programmed into neural network 144, the closed-loop control system of FIG. 1 can operate to closely control the plasma formed in the plasma reaction chamber 102 to accomplish RIE oxide etching. Additionally, the microcontroller 122 (or another component) can keep a history file of the error signals generated over the lines 120, analyzing trends and signaling when a failure is likely or when adjustment is required. Maintenance and repair can then be predicted in advance and be performed on the equipment at a time when it will least impact the manufacturing schedule.

In the above example of a $CHF_3+H_2$ RIE oxide etching process step, using the above-mentioned 30 experiments to determine synaptic interconnection weights for a three-level neural network, the neural network output signals predict the input parameters for a given plasma very accurately. The RMS deviation between the true input parameters and the neural network output values, over all 30 training experiments, are as follows:

| Parameter | RMS Deviation |
|---|---|
| H₂ gas | 0.29% |
| CHF₃ gas | 0.19% |
| Power | 0.33% |
| Pressure | 0.25% |

Additional numbers of neurons may be added to the hidden layer of the neural network 144 to further increase the accuracy of these results, but probably at the expense of some of the generalizing ability of the neural network. The RMS deviation between the output signals of the neural network 144 and actual process input parameter values increases to about 20% for plasma spectra which the neural network 144 has not previously seen. Such a large error for unseen data is still tolerable, however, as long as the direction of required adjustment is accurate. The large error for unseen data is explainable in part by the difficulty of the particular plasma chosen for the illustration, as well as by the large parameter space within which the input parameter values were permitted to vary in the illustration and the limited number of experiments used. In a more realistic example in which $CHF_3$, $CF_4$ and He gases are used to produce the plasma, and in which the neural network controls the flow rates of such gases, the pressure in the chamber, and the power applied to the plates, and in which the parameter space is a much more reasonable ±5% of the target value, the resulting RMS deviation reduces to only about 4% for unseen data.

One of the problems with using the neural network for a spectral analysis is the large number of input channels involved. For a neural network, the large number of input channels implies a very large number of parameters (weights) to be adjusted during the learning process. For example, a 731-8-4 node network includes 731×8+8×4= 5880 parameters (excluding additional biasing parameters) which require adjusting. This results in a lengthy training period. Additionally, the neural network does not typically incorporate any expert knowledge which may already be known about the problem being analyzed. The neural network 144 of FIG. 1 can accordingly be modified in order to include fuzzy filtering which addresses these problems. Fuzzy filtering is the task of partitioning a massive amount of physical channels into a much smaller number of fuzzy channels. These channels, adaptive during the training process, can perform both noise filtering and feature detection. System parameters such as the membership functions defined for each fuzzy channel and the weights in the feed-forward network are calibrated with backward error propagation. Fuzzy logic is described in Zadeh, "Fuzzy Logic", IEEE Computer, pp. 83–93 (1988), incorporated by reference herein.

Fuzzy filtering assumes the boundary between two neighboring meaningful channels as a continuous, overlapping area in which an input channel has partial membership in both fuzzy channels. A fuzzy channel defines a range of input wavelengths characterized by an appropriate membership function. The position and shape of this membership function is parameterized, so that it can be adjusted during the learning process so that system error is minimized. At the end of the training, the position and shape of the membership functions can be expected to reveal the most important input channels so as to provide a meaningful interpretation of the qualitative aspects of the analysis.

Figure 7:
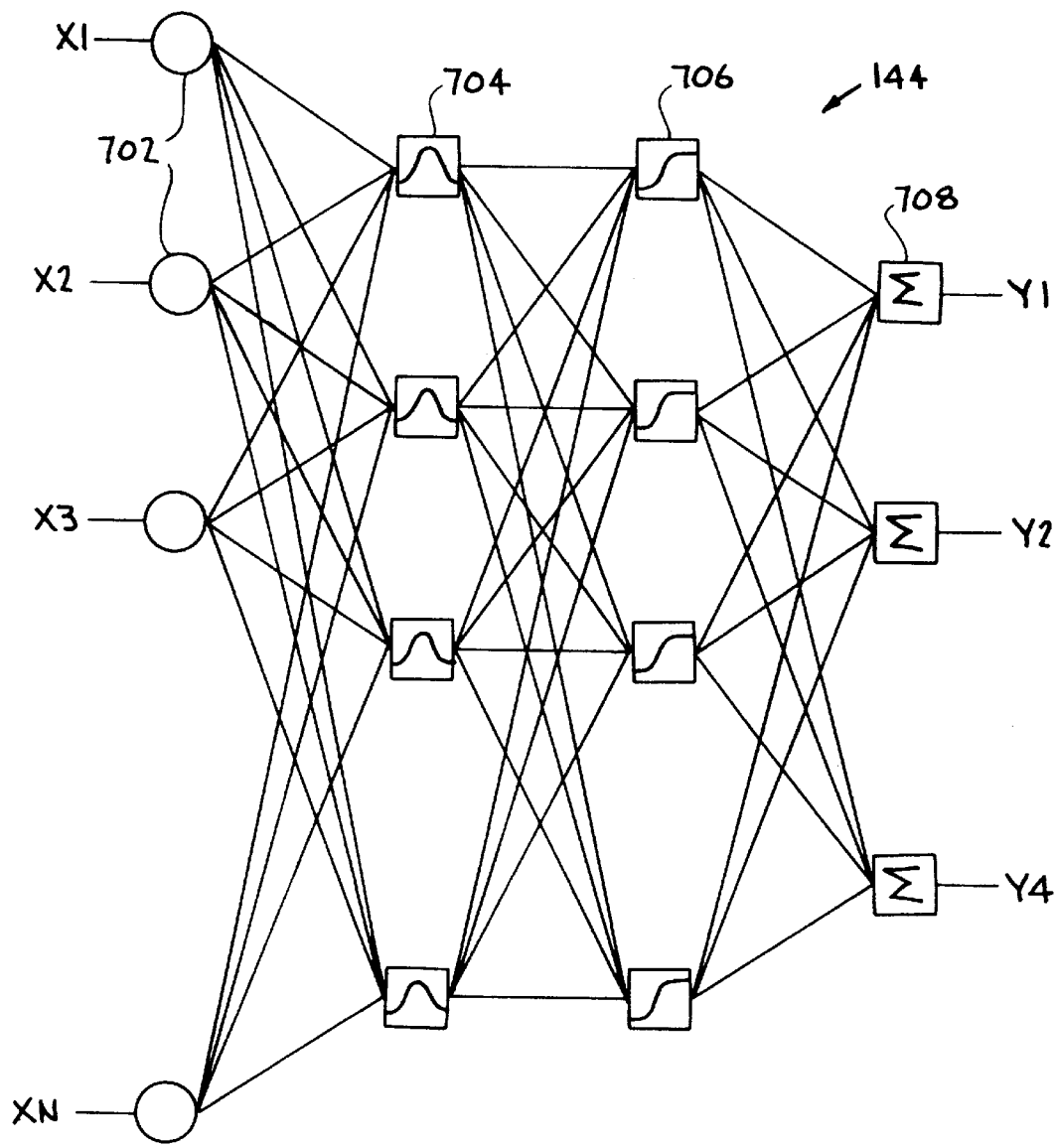
FIG. 7 is a symbolic block diagram of an alternative neural network of FIG. 1.

FIG. 7 shows the topology of a neural network 144 (FIG. 1) which incorporates fuzzy filtering. It includes N input excitation neurons 702, M second-level nodes 704 (M<N), L third-level neurons 706, and K output neurons 708. For a $CHF_3+H_2$ oxide etching process step, there may be 731 input nodes 702, eight second-level nodes 704, eight third-level nodes 706, and four output nodes 708.

Each node in the network of FIG. 7 performs a particular function (a "node function") based on the incoming signals and a set of parameters pertaining to the node. All the nodes in a given layer in this embodiment have the same type of node function. In particular, the nodes of layer one may simply be isolation buffers. Each of the nodes 704 in layer two is associated with a parameterized bell-shaped membership function given as:

$$\mu_{Aj}(i) = \frac{1}{1 + \left[\left(\frac{i - c_j}{a_j}\right)^2\right]^{b_j}},$$

where i is the input channel number, j is the number of the particular second-level node 704, A is the linguistic term associated with the node function, and the adjustable parameters are $a_j$, $b_j$, and $c_j$. The output signal from each of the i'th one of the first-level nodes 702 is therefore weighted by the function $\mu_{Aj}$ (i) in its connection to the j'th one of the second-level nodes 704. Each j'th one of the second-level neurons 704 then sums its weighted input values and divides by a normalization factor to produce an output signal. The node output is accordingly given by:

$$\frac{\Sigma_i \mu_{Aj}(i) x_i}{\Sigma_i \mu_{Aj}(i)}.$$

The initial values of the parameters are set in such a way that the membership functions satisfy "ε completeness" (with ε=0.5, for example), "normality" and "convexity". See "Introduction to Fuzzy Arithmetic: Theory and Applications", Arnold Kaufmann and Madan M. Gupta, Van Nostrand Reinhold Co., 1985, and "Fuzzy Logic in Control Systems: Fuzzy Logic Controller", C. C. Lee, IEEE Trans. on Systems, Man, and Cybernetics, 20(2):404–435, 1990. Although these initial membership functions are set heuristically and subjectively, they do provide an easy interpretation parallel to human thinking. The parameters are later tuned with backpropagation in the learning process based on the training data set. Better initial weightings can be designed by using the Central Limit Theorem to prevent saturation of the neural network.

The third layer nodes 706 perform as a hidden layer as in a standard neural network, taking weighted sums of the second-level node outputs and producing the transformed output through a sigmoidal function. The fourth-level nodes 708 are similar except for the omission of the transfer function because the output values are prescaled.

Note that with given values of the membership function parameters for second-level nodes 704, and P training data, P linear equations can be derived in terms of the parameters in the fourth-level neurons 708. These equations can be solved computationally by using the Kalman filter algorithm as described in "Fuzzy modeling based on generalized neural networks and fuzzy clustering objective functions", Chuen-Tsai Sun and Jyh-Shing Jang, in "Proceedings of the 30th IEEE Conference on Decision and Control", 1991. This technique can accelerate the learning process where learning is accomplished by computer simulation.

It can be seen that the use of a fuzzy filtering mechanism as shown in FIG. 7 simplifies the neural network architecture because far fewer system parameters need to be adjusted. In particular, in the architecture of FIG. 7, three parameters ($a_j$, $b_j$ and $c_j$) need to be adjusted for each of the M second-level nodes 704, in addition to M input weighting adjustments for each of the L third-level neurons 706, and L input weighting adjustments for each of the four output neurons 708. For N=731, M=8, L=8 and K=4, this results in only 3×8+8×8+ 8×4 =120 parameters to be adjusted. For N=731, M=L=15 and K=4, only 330 parameters need to be adjusted (excluding bias weights). This benefits learning efficiency, and at the same time provides a meaningful interpretation for the training results in order to better understand the sophisticated nature of plasma emission.

As mentioned, the techniques described herein for controlling a plasma etching process step on a semiconductor wafer can easily be applied to most types of plasma-based processing steps for most surfaces. It can be used, for example, in the manufacture of active matrix liquid crystal displays, either in PECVD or sputtering steps, or in the formation of thin films such as those used in superconductors and in magnetic and optical storage surfaces.

In addition, the technique can be generalized to apply to processes which are not plasma-based, if appropriate input is provided to the neural network to characterize the reaction taking place. Such processes include, without limitation, Atmospheric Pressure and Low Pressure Chemical Vapor Deposition (collectively Chemical Vapor Deposition, or CVD) from a gaseous environment onto a workpiece (see Sze, Chapter 6); diffusion of impurities from a gaseous environment into a workpiece (see Sze, Chapter 7); and Physical Vapor Deposition (PVD) from a gaseous environment onto a workpiece (see Sze, Section 9.4). The input can be an optical frequency spectrum or another electromagnetic frequency spectrum, or it can be a non-frequency spectrum such as a mass spectrum produced by a residue gas analyzer (RGA). As another example, the input to the analyzer 118 can be an emission spectrum such as that produced by laser-induced fluorescence, or the spectra produced by calorimeters, photometers, spectrophotometers, atomic absorption spectrometers or by other techniques of absorption spectroscopy.

The invention has been described with respect to particular embodiments thereof and it will be understood that numerous modifications and variations are possible without departing from its scope.

I claim:

1. A method for closed-loop adaptive control of spectrum-producing plasma processes, comprising the steps of:

producing a plasma adjacent to a subject surface of a workpiece, said plasma having characteristics dependent upon a plurality of process input parameters;

while said plasma is adjacent to said subject surface, observing the optical frequency spectrum produced by said plasma;

while said plasma is adjacent to said subject surface, controlling one of said process parameters in response to said optical frequency spectrum;

wherein said step of observing comprises passing spectral emissions from said plasma through a window in a chamber containing said plasma and said subject surface; preventing deposition of material on the inside surface of said window; and analyzing the frequency spectrum of said emissions as viewed through said window.

2. A method for closed-loop adaptive control of spectrum-producing plasma processes, comprising the steps of:

producing a plasma adjacent to a subject surface of a workpiece, said plasma having characteristics dependent upon a plurality of process input parameters;

while said plasma is adjacent to said subject surface, observing the optical frequency spectrum produced by said plasma;

while said plasma is adjacent to said subject surface, controlling one of said process parameters in response to said optical frequency spectrum;

wherein said step of observing comprises conducting spectral emissions from said plasma through a narrow tube from said plasma to a window in a chamber containing said plasma and said subject surface, said tube comprising no deposition surface between said plasma and said window which could filter said optical spectrum; passing said emissions through said window; and analyzing the frequency spectrum of said emissions as viewed through said window.

3. A method for neural-network closed-loop adaptive control of spectrum-producing plasma processes, comprising the steps of:

producing a plasma adjacent to a subject surface of a workpiece, said plasma having characteristics dependent upon a plurality of process input parameters;

while said plasma is adjacent to said subject surface, observing the optical frequency spectrum produced by said plasma;

while said plasma is adjacent to said subject surface, controlling one of said process parameters in response to said optical frequency spectrum;

wherein said step of controlling comprises using a neural network to produce a control signal for said one of said process parameters in response to said optical frequency spectrum;

wherein said step of observing comprises conducting spectral emissions from said plasma through a narrow tube from said plasma to a window in a chamber containing said plasma and said subject surface, said tube comprising no deposition surface between said plasma and said window which could filter said optical spectrum; passing said emissions through said window; and analyzing the frequency spectrum of said emissions as viewed through said window.

4. A method for closed-loop adaptive control of spectrum-producing plasma processes, comprising the steps of:

producing a plasma adjacent to a subject surface of a workpiece, said plasma having characteristics dependent upon a plurality of process input parameters;

while said plasma is adjacent to said subject surface, observing the optical frequency spectrum produced by said plasma;

while said plasma is adjacent to said subject surface, controlling one of said process parameters in response to said optical frequency spectrum;

wherein said step of observing generates an amplitude value corresponding to each of a plurality of wavelengths in said optical spectrum, and wherein said step of controlling comprises generating at least one second-level weighted sum of said amplitude values; and producing a control signal for said one of said process parameters in response to said at least one second-level weighted sum.

5. The method of claim 4, wherein said at least one second-level weighted sum is a sigmoid-limited weighted sum of said amplitude values.

6. The method of claim 4, wherein said step of producing a control signal comprises the steps of:

generating a third-level weighted sum of said at least one second-level weighted sums; and producing said control signal in response to said third-level weighted sum.

7. The method of claim 4, wherein said step of generating said at least one second-level weighted sum comprises generating at least one second-evel weighted sum in response to a learned weighting corresponding to each of said amplitude values, and prior to said step of observing:

ascribing initial values to said learned weightings;

setting said one of said process parameters to one of a plurality of known teaching values;

producing an experimental plasma, being the plasma produced in response to said one of said process parameters;

adjusting at least one of said learned weightings such that said control signal produced in response to said experimental plasma is a desired value; and repeating the steps of setting, producing and adjusting until the control signals produced for each of said plurality of known teaching values approximate a predetermined level of precision.

8. A method according to claim 1, wherein said step of controlling further comprises the step of adjusting a valve for said one of said process parameters in response to said control signal.

\* \* \* \* \*